United States Patent [19]

Potter

[11] Patent Number: 4,621,708

[45] Date of Patent: Nov. 11, 1986

[54] TWEETER BIDIRECTIONAL RADIATING

[75] Inventor: Dewey Potter, Holliston, Mass.

[73] Assignee: Bose Corporation, Framingham, Mass.

[21] Appl. No.: 642,531

[22] Filed: Aug. 20, 1984

[51] Int. Cl.[4] ............................................... H05K 5/00

[52] U.S. Cl. ................................... 181/144; 181/145; 181/154; 181/199

[58] Field of Search ................................ 181/144–147, 181/155, 156, 199, 154; 381/88–90

[56] References Cited

U.S. PATENT DOCUMENTS

| | | | |
|---|---|---|---|
| Re. 31,679 | 9/1984 | Froeschle et al. | 181/147 X |
| 2,217,279 | 10/1940 | Karns | 181/145 |
| 4,133,975 | 1/1979 | Barker, III | 181/144 X |
| 4,251,687 | 2/1981 | Deutsch | 181/156 X |
| 4,266,092 | 5/1981 | Barker, III | 181/144 X |
| 4,475,620 | 10/1984 | Carlsson | 181/146 |

*Primary Examiner*—Benjamin R. Fuller
*Attorney, Agent, or Firm*—Charles Hieken

[57] ABSTRACT

A loudspeaker system includes a cabinet with top, bottom, front, rear and side panels enclosing a volume with the top and bottom panels extending to one side of the enclosed volume and supporting an angled tweeter baffle therebetween that supports a tweeter that radiates rearward and outward from its front surface and forward and inward from its back surface. The side panels adjacent to the tweeter baffle are angled with the front angled side panel formed with an opening accommodating a port tube. The tweeter is a cone loudspeaker driver having a basket formed with openings exposing the cone to the rear.

19 Claims, 9 Drawing Figures

TWEETER BIDIRECTIONAL RADIATING

The present invention relates in general to loudspeaker systems and more particularly concerns novel apparatus and techniques for efficiently and economically reproducing sound with relatively compact inexpensive apparatus.

The internationally known BOSE 901, 601, 501, 301 and 201 loudspeaker systems embody principles for simulating in the home sound of the character heard in the concert hall by providing, inter alia, a good balance of reflected and direct sound. U.S. Pat. Nos. 4,133,975 and 4,266,092 describe the BOSE 301 loudspeaker system having a woofer mounted on a front panel and a tweeter mounted on an angled panel beside the woofer, both drivers radiating into the listening area only from the front surface of each driver. Crossover or transition network means couple electrical energy from an input terminal pair to the woofer and tweeter so that the woofer and tweeter radiate energy over a common frequency range.

It is an important object of this invention to provide an improved loudspeaker system.

According to the invention, there is cabinet means for supporting loudspeaker drivers. First loudspeaker driver means supported by the cabinet means is for radiating sound energy to the front over a first frequency range and has a first polar response. Second loudspeaker driver means comprising a tweeter supported by the cabinet means is for radiating sound energy over a second frequency range mostly higher than the first frequency range from one surface inward and from the other surface outward. Preferably, radiation from the first surface is inward and forward and that from the rear surface is rearward against a reflecting surface. The second loudspeaker driver means is preferably an openbacked tweeter mounted on an angled baffle of the cabinet means free from obstruction to both the rear and the front to allow radiation to occur from both surfaces.

Numerous other features, objects and advantages of the invention will become apparent from the following specification when read in connection with the accompanying drawing in which.

Figure 1:
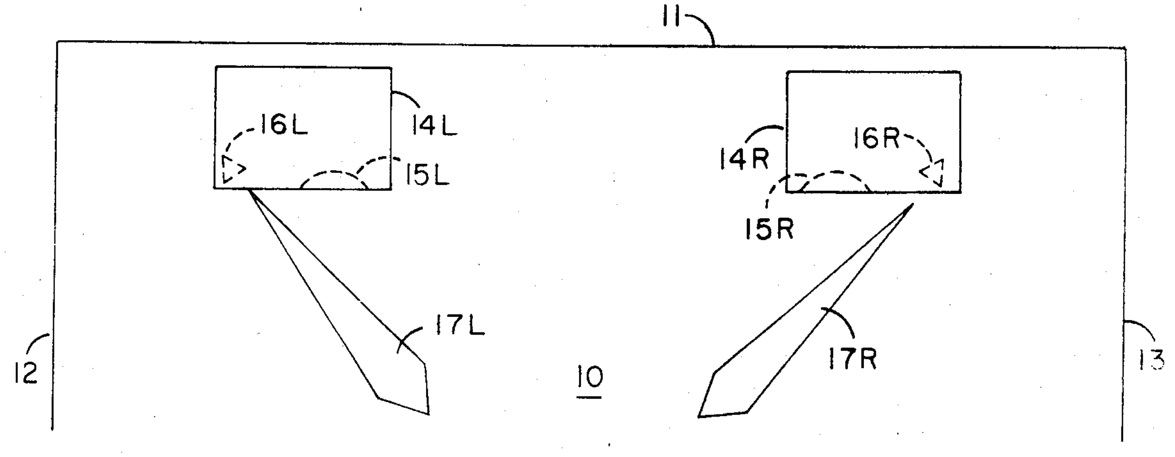
FIGS. 1, 2 and 3 are a diagrammatic representation of a stereo loudspeaker system according to the invention positioned along the rear wall of a room illustrating the forward and inward radiation of the tweeter, the rearward and outward radiation from the tweeter back surface, and the combination of tweeter radiation and woofer radiation, respectively.

With reference now to the drawing and more particularly FIG. 1 thereof, there is shown a diagrammatic representation of a stereo system according to the invention in a room 10 adjacent a rear wall 11 that intersects left and right walls 12 and 13, respectively. Left loudspeaker cabinet 14L and right loudspeaker cabinet 14R each have a woofer 15L, 15R and a tweeter 16L, 16R located nearer to the left and right walls 12 and 13, respectively, than to woofer 15L and 15R, respectively. Loudspeaker cabinets 14L and 14R are arranged as the mirror images of each other with the axes of tweeters 16L and 16R aligned along the length of forward radiation indicating patterns 17L and 17R, respectively. Each tweeter 16L, 16R, is mounted on a baffle to provide a desired low frequency tweeter response, typically by cancellation of sound pressure front to back around the tweeter baffle starting at 2 KHz and will be down 20 dB at 500 Hz. Each baffle-mounted tweeter is oriented at an angle and displacement relative to the axis of each woofer 15L, 15R to provide a preferred balance of outward radiating energy to inward radiating energy so that about 60% of the energy first reflects off a wall before entering the listening area while about 40% enters the listening area directly and perferred acoustic coupling to the woofer to provide a smooth midrange response. Each baffle-mounted tweeter is practically surrounded by open grill which provides an acoustically transparent cabinet allowing unobstructed sound to travel from the enclosure in a controlled pattern. High frequencies from each tweeter are directed inward for improved localization as represented by patterns 17L and 17R and outward for an improved spatious stereo image as represented by patterns 18L and 18R shown in FIG. 2.

The outward firing energy represented by patterns 18L and 18R is reflected off sidewalls 12 and 13, respectively, to provide a broad sound source that extends beyond loudspeaker cabinets 14L and 14R while enhancing stereo separation throughout the listening area.

Figure 2:
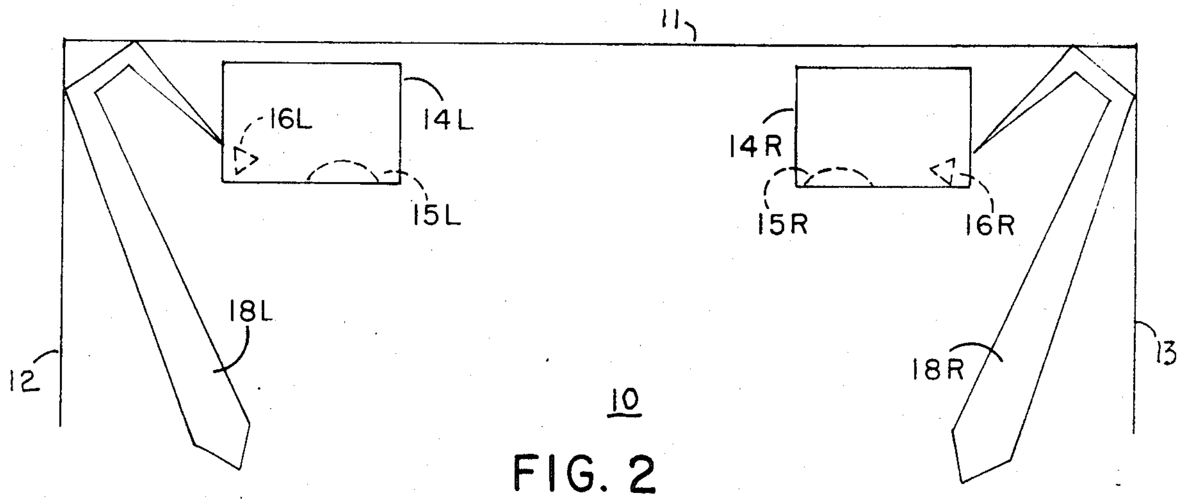
Figure 3:
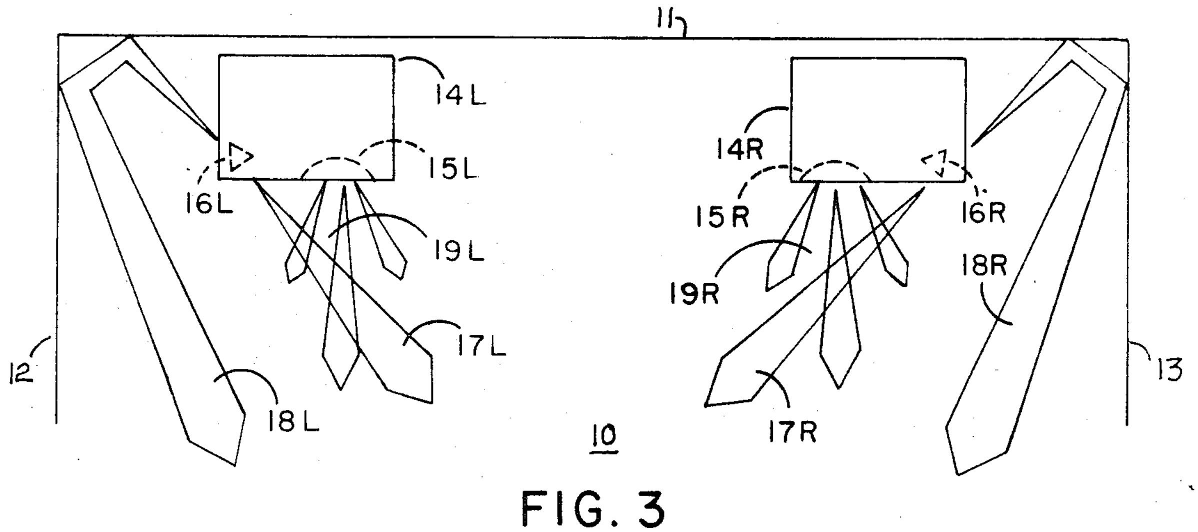

Referring to FIG. 3, there is shown the stereo system of FIGS. 1 and 2 according to the invention with the representations of the forward-inward radiation 17L, 17R, outward-rearward radiation 18L, 18R, and woofer patterns 19L, 19R. The result is a quality of sound that approaches concert hall realism with proper stereo separation perceived from nearly any seating position in the room.

Figure 4:
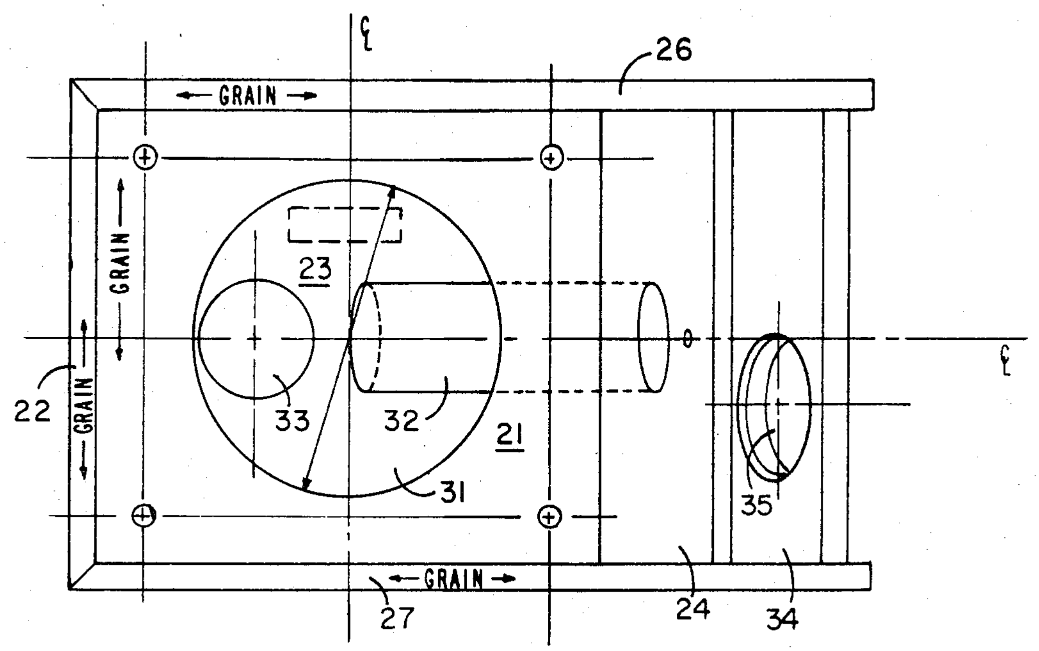
FIGS. 4 and 5 are front and side views, respectively, of a loudspeaker cabinet according to the invention.
Figure 6:
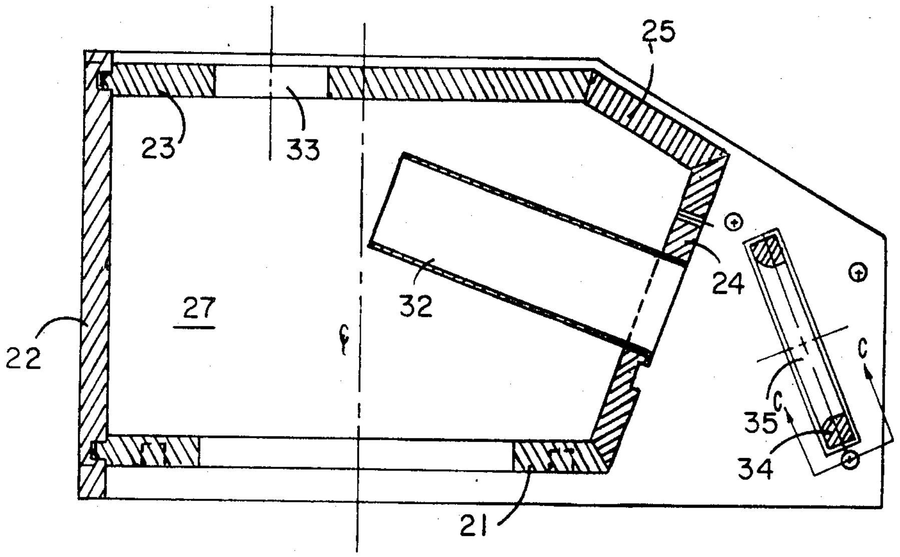
FIG. 6 is a view through section 6—6 of FIG. 4.
Figure 5:
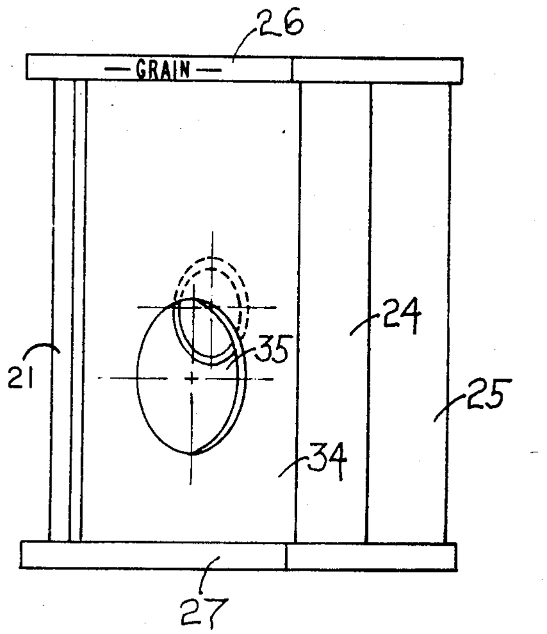

Referring to FIGS. 4, 5 and 6 there are shown front, side and sectional views, respectively, of a cabinet according to the invention. The cabinet includes a front panel 21, side panel 22, rear panel 23, front angled panel 24 and rear angled panel 25, top panel 26 and bottom panel 27. Front panel 21 is formed with an opening 31 for accommodating a woofer, such as 15L, 15R. Front angled panel 24 is formed with an opening accommodating port tube 32. Rear panel 23 is formed with an opening 33 for accommodating a terminal panel.

An angled tweeter baffle 34 is formed with an opening 35 for accommodating a tweeter, such as 16L, 16R. The angle between tweeter baffle 34 and the front edge of bottom and top panels 26 and 27 is typically 67° so that the axis of tweeter opening 35 with the front panel is substantially 33°. The tweeter diameter is about three times the width of the baffle portion adjacent the horizontal diameter of tweeter opening 35.

Figure 7:
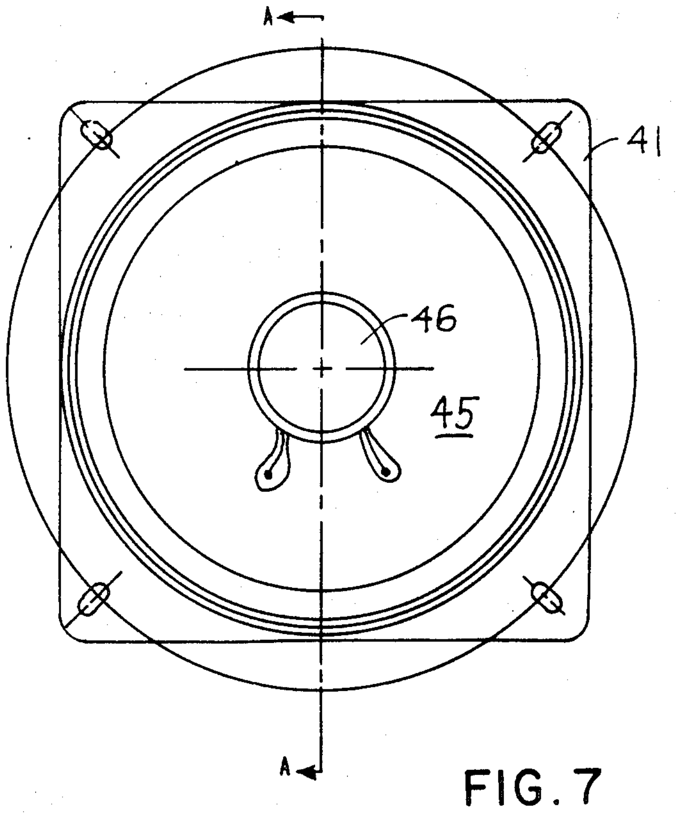
FIGS. 7 and 8 are front and rear view, respectively, of a tweeter according to the invention.
Figure 8:
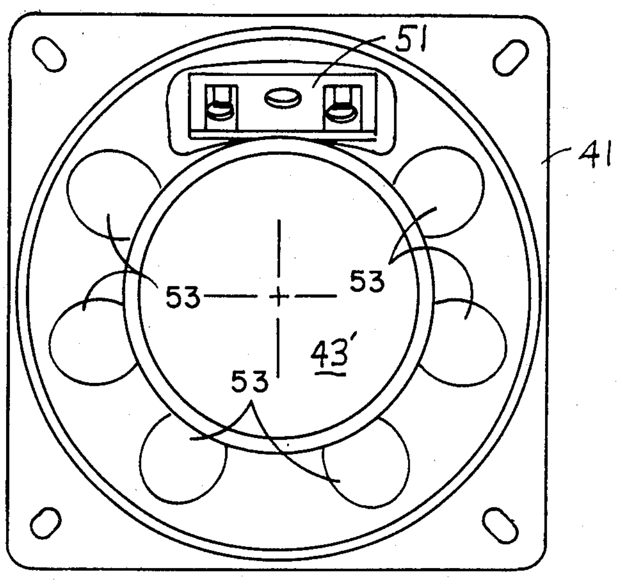
Figure 9:
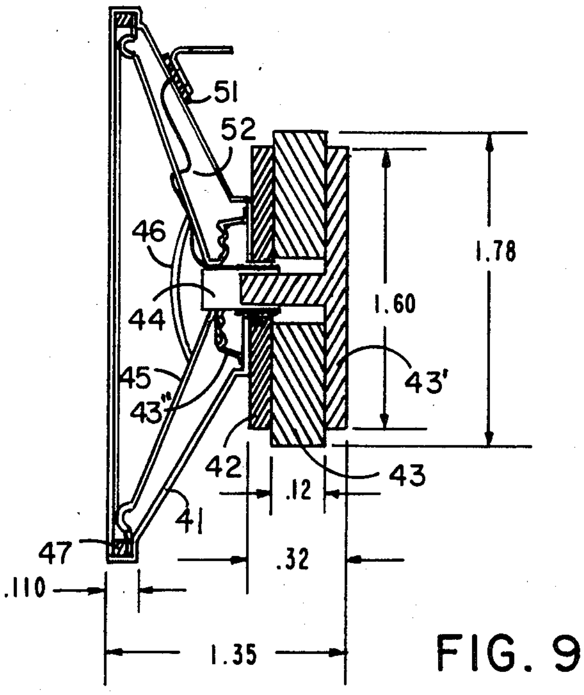
FIG. 9 is a view through section 9—9 of FIG. 7.

Referring to FIGS. 7, 8 and 9, there are shown front, rear and sectional views, respectively, of a tweeter according to the invention. The tweeter comprises a basket 41 attached to front plate 42 with a magnet 43 sandwiched between front plate 42 and back plate 43. Frame 41 supports spider 43" which carries voice coil 44 to which the center of cone 45 is attached. Dust cover 46 covers the center of cone 45. The edge of cone 45 is fastened to the edge of frame 41 by pad ring 47. Frame 41 also carries on its rear terminal strip 51 with tinsel 52 connecting the voice coil leads to terminals on terminal strip 51. Frame 41 is formed with a number of openings 53 that allow high frequency energy to radiate to the rear.

The invention has a number of features. The angled tweeter baffle directs high frequency energy both forward and inward and rearward and outward for reflection to achieve advantages noted above. The angled side panel carrying port tube allows port tube 32 to clear the rear of a woofer, such as 15L, 15R while creating additional volume for the woofer. The port is vented into this volume before air hits the grille cloth which would cause a noise and cloth flapping. Only the right cabinet has been shown in FIGS. 4–6, it being understood that the left cabinet is the mirror image of the right cabinet.

There has been described novel apparatus and techniques for providing a loudspeaker system characterized by exceptional realistic sound reproduction with a compact relatively inexpensive structure. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed.

What is claimed is:

1. A loudspeaker system comprising,
cabinet means for supporting loudspeaker drivers,
said loudspeaker cabinet means including means for supporting woofer means in a substantially enclosure volume,
tweeter support means associated with said cabinet means outside said substantially enclosed volume for supporting tweeter means at an angle with the axis of said woofer means,
and at least one tweeter means consisting of a single driver for radiating sound energy outside said cabinet means to both the rear and front supported by said tweeter support means,
said tweeter support means comprising tweeter baffle means for allowing cancellation of sound pressure front-to-rear around said baffel means below a predetermined frequency in the middle range of audio frequencies to establish a desired low frequency response of the supported tweeter means.

2. A loudspeaker system in accordance with claim 1 wherein said cabinet means comprises top, bottom and side panels enclosing a volume in which said woofer means is supported,
said top and bottom panels extending beyond a side of said enclosed volume,
said tweeter support means comprising said tweeter baffle means located in the region between said top and bottom panels outside said enclosed volume,
the width of said tweeter baffle means coacting with said tweeter means to establish a desired low frequency response of said tweeter means by determining the frequency at which front to rear cancellation occurs.

3. A loudspeaker system in accordance with claim 2 wherein said tweeter means comprises a tweeter cone and basket formed with openings exposing the tweeter cone to the rear to allow sound energy radiated by the tweeter cone to emerge through said openings to the rear of said tweeter means.

4. A loudspeaker system in accordance with claim 3 wherein said loudspeaker cabinet means comprises a first angled side panel adjacent to said baffle means formed with an opening,
a port tube seated in said opening,
and second angled side panel means continguous with said first angled side panel means for enclosing a side of said enclosed volume adjacent to said tweeter baffle means.

5. A loudspeaker system in accordance with claim 3 wherein the angle of said baffle means with the axis of said woofer means is substantially 67°.

6. A loudspeaker system in accordance with claim 2 wherein said tweeter baffle means is formed with an opening for accommodating said tweeter means,
the diameter of said opening being of the order of three times the width of the baffle portion adjacent to a normally horizontal diameter of said opening.

7. A loudspeaker system in accordance with claim 6 wherein most of said opening is located below a plane passing through the center of said loudspeaker cabinet means.

8. A loudspeaker system in accordance with claim 7 wherein said loudspeaker cabinet means comprises a first angled side panel adjacent to said baffle means formed with a port opening,
a port tube seated in said opening,
second angled side panel means continguous with said first angled side panel means for enclosing a side of said enclosed volume adjacent to said tweeter baffle means,
a front panel formed with a woofer opening for exposing said woofer means,
said woofer opening and said port tube opening being symmetrical about a normally horizontal plane passing through the center of said loudspeaker cabinet means and parallel to said top and bottom panels.

9. A loudspeaker system in accordance with claim 1 wherein said tweeter support means comprises baffle means of width so as to coact with said tweeter means to establish a desired low frequency response of said tweeter means by determining the frequency at which front to rear cancellation occurs.

10. A loudspeaker system in accordance with claim 9 wherein said width is such as to effect cancellation of sound pressure front-to-rear around said baffle starting at substantially 2 kHz so as to be down substantially 20 dB at 500 Hz.

11. A loudspeaker system in accordance with claim 2 wherein said width is such as to effect cancellation of sound pressure front to back around said baffle starting at substantially 2 kHz so as to be down substantially 20 dB at 500 Hz.

12. A loudspeaker system in accordance with claim 1 wherein said cabinet means comprises top, bottom and side panels enclosing a volume in which said woofer means is supported,
the width of said tweeter baffle means coacting with said tweeter means to establish a desired low frequency response of said tweeter means by determining the frequency at which front to rear cancellation occurs.

13. A loudspeaker system in accordance with claim 12 wherein said tweeter means comprises a basket formed with openings exposing the tweeter cone to the rear to allow sound energy radiated by the tweeter cone to emerge through said openings to the rear of said tweeter means.

14. A loudspeaker system in accordance with claim 13 wherein said loudspeaker cabinet means comprises a first angled side panel adjacent to said baffle means formed with an opening, a port tube seated in said opening, and second angled side panel means continguous with said first angled side panel means for enclosing a side of said enclosed volume adjacent to said tweeter baffle means.

15. A loudspeaker system in accordance with claim 13 wherein the angle of said baffle means with the axis of said woofer means is substantially 67°.

16. A loudspeaker system in accordance with claim 12 wherein said tweeter baffle means is formed with an opening for accommodating said tweeter means, the diameter of said opening being of the order of three times the width of the baffle portion adjacent to a normally horizontal diameter of said opening.

17. A loudspeaker system in accordance with claim 16 wherein most of said opening is located below a plane passing through the center of said loudspeaker cabinet means.

18. A loudspeaker system in accordance with claim 17 wherein said loudspeaker cabinet means comprises a first angled side panel adjacent to said baffle means formed with a port opening, a port tube seated in said opening, second angled side panel means continguous with said first angled side panel means for enclosing a side of said enclosed volume adjacent to said tweeter baffle means, a front panel formed with a woofer opening for exposing said woofer means, said woofer opening and said port tube opening being symmetrical about a normally horizontal plane passing through the center of said loudspeaker cabinet means and parallel to said top and bottom panels.

19. A loudspeaker system in accordance with claim 12 wherein said width is such as to effect cancellation of sound pressure front-to-rear around said baffle starting at substantially 2 kHz so as to be down substantially 20 dB at 500 Hz.

* * * * *

UNITED STATES PATENT AND TRADEMARK OFFICE

CERTIFICATE OF CORRECTION

PATENT NO. : 4,621,708

DATED : November 11, 1986

INVENTOR(S) : Dewey Potter

It is certified that error appears in the above-identified patent and that said Letters Patent is hereby corrected as shown below:

In column 3, lines 31-32, "enclosure" should read --enclosed--.

Signed and Sealed this

Ninth Day of July, 1991

Attest:

HARRY F. MANBECK, JR.

*Attesting Officer* *Commissioner of Patents and Trademarks*